United States Patent [19]

Aiken, deceased et al.

[11] 4,021,790
[45] May 3, 1977

[54] MUTUALLY EXCLUSIVE MAGNETIC BUBBLE PROPAGATION CIRCUITS

[75] Inventors: Howard H. Aiken, deceased, late of Fort Lauderdale, Fla., by Mary E. Aiken, executrix; Paul T. Bailey, Creve Cour, Mo.; Robert C. Minnick, Houston, Tex.

[73] Assignee: Monsanto Company, St. Louis, Mo.

[22] Filed: Jan. 11, 1974

[21] Appl. No.: 432,450

[52] U.S. Cl. ......................................... 340/174 TF
[51] Int. Cl.² ..................................... G11C 19/08
[58] Field of Search ............... 340/174 TF, 174 SR

[56] References Cited

UNITED STATES PATENTS

| 3,508,225 | 4/1970 | Smith | 340/174 TF |
| 3,518,643 | 6/1970 | Pemeski | 340/174 TF |
| 3,750,154 | 7/1973 | Almasi | 340/174 TF |
| 3,760,390 | 9/1973 | Murakami | 340/174 TF |
| 3,815,107 | 6/1974 | Almasi | 340/174 TF |

OTHER PUBLICATIONS

AIP Conference Proceedings "Propagation Characteristics of Parallel Bar Circuits," by Ng et al., No. 13, Part 1, Nov. 13–16, 1973; pp. 127–131.

IBM Tech. Disc Bull., "Bubble Domain Logic Circuits," by Lin; vol. 13; No. 10; 3/71; pp. 3019, 3020.

IBM Tech Disc. Bull., "Herringbone Pattern for Cylindrical Magnetic Domains," by Reefe et al., vol. 13, No. 11; 4/71; pp. 3307, 3308.

*Primary Examiner*—James W. Moffitt
*Attorney, Agent, or Firm*—Lane, Aitken, Dunner & Ziems

[57] ABSTRACT

Closed loop propagation channels for magnetic bubbles are mutually exclusively accessed by means of two different sets of repeating sequences of discrete, pulsed magnetic drive field orientations. A closed loop bubble propagation circuit is driven by a repeating sequence of pulsed orientations in which a plurality of interlaced subsets of the sequence operate corresponding sections of the circuit. A closed loop zigzag circuit traversing sections of the loop parallel to the sides of an equilateral triangle is driven by a sequence of pulsed field orientations aligned respectively with the sides of the equilateral triangle. Continuous overlay circuits are introduced driven by sequences of discrete nonorthogonal, pulsed drive field orientations repetitively realigning with consecutive segments of the overlay circuit.

31 Claims, 8 Drawing Figures

MUTUALLY EXCLUSIVE MAGNETIC BUBBLE PROPAGATION CIRCUITS

BACKGROUND OF THE INVENTION

The invention relates generally to the field of magnetic bubble technology (MBT) and, more particularly, to means for propagating or transmitting magnetic bubbles, especially in recirculating closed loops.

Briefly, MBT involves the creation and propagation of magnetic bubbles in specially prepared magnetic materials. The word "bubble", used through this text, is intended to encompass any single-walled magnetic domain, defined as a domain having an outer boundary which closes on itself. The application of a static, uniform magnetic bias field orthogonal to a sheet of magnetic material havng suitable uniaxial anisotropy causes the normally random serpentine pattern of magnetic domains to shrink into short cylindrical configruations or bubbles whose common polarity is opposite that of the bias field. The bubbles repell each other and can be moved or propagated by a magnetic field in the plane of the sheet.

Many schemes exist for propagating bubbles along predetermined channels. These techniques can be classed generally as conductor-accessed and field-accessed. In conductor-accessed propagation systems, loops of electrical conductors are disposed in series over the magnetic sheet. A propagation system has been proposed using a "serpentine" conductor criss-crossing a ferromagnetic rail defining stable complementary bubble positions. In field-accessed propagation systems electrical conductors are not disposed on the magnetic sheet for propagation; instead, an overlay pattern of ferromagnetic elements establishes a bubble propagation channel in which a sequence of attracting poles is caused to be formed in the presence of a continuous, uniformly rotting magnetic drive field in the plane of the sheet. A major distinction in function between conductor-accessed and field-accessed circuits is that several conducor-accessed circuits can be disposed on the same sheet or "bubble chip" and operated completely separately and exclusively from each other, while field-accessed circuits on the same chip all operate the same time under the control of an ubiquitous, uniformly rotating, common drive field.

One attempt at providing field-accessed circuit section in the prior art is shown in U.S. Pat. No. 3,543,252 to Perneski illustrating several variations on the familiar T-bar circuit driven by different permutations of pulsed orthogonal drive fields.

MBT can be used in data processing because magnetic bubbles can be propagated through channels, whether field-accessed or conductor-accessed at a precisely determined rate so that uniform data streams of bubbles are possible in which the presence or absence of a bubble at a particular position within the stream indicates a binary 1 or 0. Because of its potential for low cost, low power consumption and extremely high bit density, MBT is under active consideration for use in large scale relatively low speeds memories. One of the prime design elements of many memory systems utilizing field-accessed magnetic bubbles is the provision of a serial closed loop bubble path which can be ued as a recirculating "shift registor". Many memory arrangements of this type employ a plurality of "minor" loops selectively interconnectible with a "major" loop such that bubbles can be transferred between the major and minor loops on command. The ability to propagate bubbles in one recirculating loop without operating other loops on the same chips has in the past been confined to systems employing conductor-accessed circuits.

Another consideration to which this application is directed is the desirability of providing a segmented continuous overlay rather than discrete spaced element such as those used in chevron and T-bar circuits. U.S. Pat. No. 3,518,643 to Perneski illustrates zigzag and crenallated forms of continuous overlay patterns based on right angles, driven by a pulsed orthogonal coil arrangement.

Other forms of pulsed field-driven circuit overlays are shown U.S. Pat. No. 3,934,236, entitled "Pulsed Field-accessed Bubble Propagation Circuits" by the same inventors as this application, filed on the same day as this application, assigned to the assignee of this application, and incorporated by reference herein.

SUMMARY OF THE INVENTION

One of the objects of the invention is to provide closed loop bubble propagation channels, field-accessed by means of nonrotating, i.e. discretely oriented, pulsed fields. Another object of the invention is to provide mutually exclusive, closed loop circuits, field-accessed by means of different sets of pulsed field orientations. A further object of the invention is to improve continuous overlay field-accessed circuits, which insure uniform bubble size by maintaining uniform bias field strength due to the absence of discrete, spaced circuit elements.

The applicants have discovered that these and other objects of the invention are accomplished by providing a closed loop bubble propagation circuit driven by a pulsed drive field assuming discrete orientations in a predetermined repeating sequence. In the preferred embodiment, subsets of a sequence of nonorthogonal field orientations are effective to drive bubbles on corresponding sides of the closed loop path. A continuous zigzag form overlay circuit traverses sides of the closed path parallel to the sides of an equilateral triangle. The drive field sequence includes three discrete orientations corresponding to the sides of the triangle. Any two of the orientations ae effective to drive bubbles along one side of the closed path. More complex forms of closed loops based on the equilateral triangle can be generated by using any closed loop zigzag circuit design as a constructional line on which to build successive zigzag circuits in the nature of a "Peano diagram".

Pulsed field-accessed, closed loop circuits are applied, in another important aspect of the invention, to the problem of field-accessed circuit selection. A pair of closed loop pulsed field-driven circuits are oriented relative to each other such that a sequence of pulsed field orientations effective to circulate bubbles one one the closed loops is ineffective to operate the other closed loop, and vice versa. Hence, the closed loops, while field-accessed, are mutually exclusive.

A semihexagonal continuous overlay circuit is driven by discrete pulsed field orientations repetitively realigning with consecutive angled segments of the overlay circuit.

DESCRIPTION OF THE PREFERRED EMBODIMENTS

Figure 1:
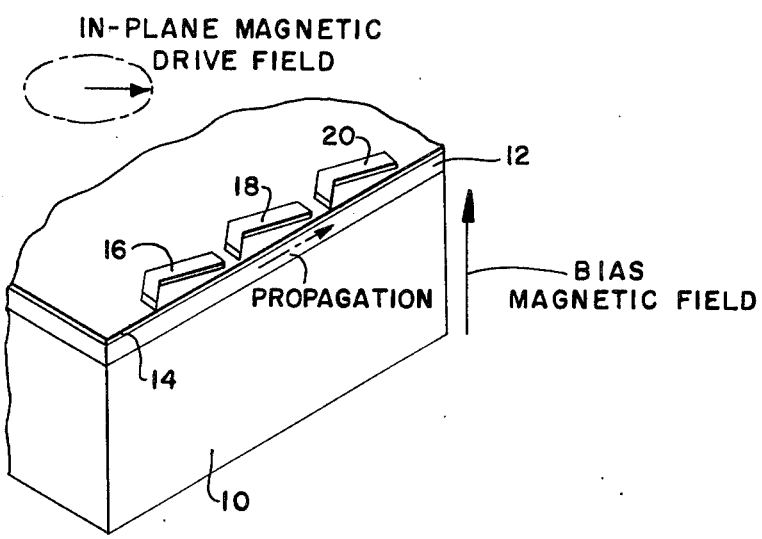
FIG. 1 is a fragmentary perspective view of a bubble chip furnished with a conventional chevron circuit.

FIG. 1 illustrates the basic components of a field-accessed garnet bubble chip having a conventional chevron circuit. A substrate 10 of nonmagnetic garnet supports an epitaxial magnetic bubble garnet layer 12 and spacing layer 14 of silicon oxide to which conventional permalloy chevron circuit elements 16, 18 and 20 are bonded. The chip is subjected to a static magnetic bias field orthogonal to the plane of the magnetic bubble garnet layer 12. In the presence of a bias field of suitable strength, cylindrical magnetic bubbles (not shown in FIG. 1) are maintained in the bubble garnet layer 12. Conventionally, a rotating, in-plane magnetic drive field, produced by an orthogonal pair of Helmholtz coils, causes bubbles to propagate from chevron circuit element 16 to element 18, for example.

Many parameters affect the performance of chevron circuits such as the number of parallel chevrons per bubble position (single chevrons are illustrated in FIG. 1), the spacing of adjacent chevron elements, their width, the magnetic properties of the overlay material, and the strenghts of the magnetic bias and drive fields.

Figure 2:
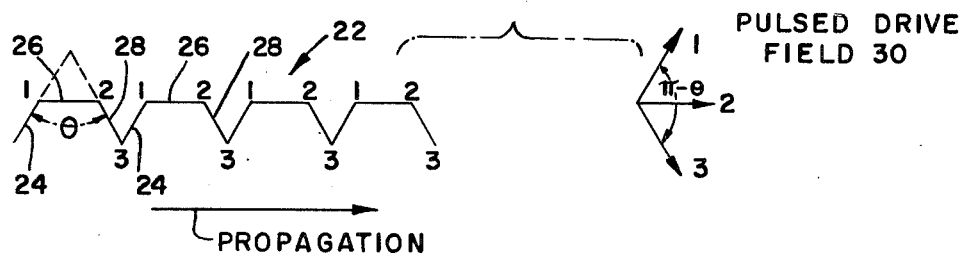
FIG. 2 is a schematic drawing illustrating a semihexagonal continuous overlay the associated drive field sequence according to the invention.

One of the problems with discontinuous circuit overlays of spaced elements, like the chevron circuit (FIG. 1), or the familiar T-bar circuit is that bubbles propagating along the circuit channel are subjected to varying bias field strength as they move from under one circuit element though a gap region to the next circuit element. A continuous circuit overlay avoiding this problem is shown in FIG. 2. The circuit overlay 22 is composed of a series of parallel semihexagonal, three-segment sections, each comprising an angled straight line segment 24 coupled by a horizontal straight segment 26 to another angled straight segment 28, to form a truncated sawtooth pattern. Segments 24 and 28 make an angle of 120° with respect to the horizontal segment 26 and the angled segments make an angle $\theta=60°$ with respect to each other. Thus the segments 24, 26 and 28 together outline one half of a hexagon. The semihexagonal sections are continuosuly interconnected by joining adjacent angled end segments 24 and 28

A pulsed field sequence 30 for propagating bubbles along the continuous overlay 22 in FIG. 2 comprises three discrete pulsed field orientations parallel to the elements 24, 26 and 28, respectively. The field sequence 30 occurs in the order indicated by the numerals associated with the field vectors. The first field orientation is aligned with segment 24, the second orientation is aligned with segment 26 and the third is aligned with segment 28. The three orientations all point in the same general direction of travel along consecutive segments in the circuit 22. The alignment and direction of the pulsed fields forms attracting poles along the line segments of the semihexagonal overlay in the sequence indicated by the numerals 1, 2 and 3 adjacent to the circut 22. Bubbles (not shown) under the circuit overlay 22 are attracted to the pole positions in the order indicated and thus traverse first the segment 24 to the position 1, next the segmennt 26 to the position 2 and finally the segment 28 to the position 3. This motion is repeated for each repetition of the field sequence 30 as bubbles move over successive semihexagonal sections in the circuit 22.

Figure 3:
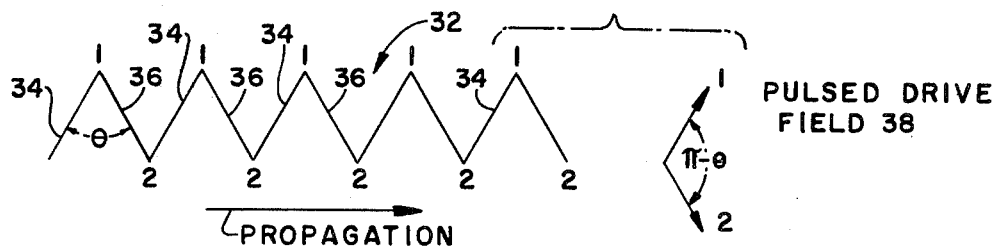
FIG. 3 is a schematic drawing illustrating a zigzag continous overlay circuit and the associated drive field sequence according to the invention.

FIG. 3 illustrates a zigzag continuous overlay channel 32 comprising alternately angled straight line segments 34 and 36 forming a regular sawtooth pattern. The segments 34 are parallel, as are the segments 36 which meet the segments 34 preferably at a 60° angle, $\theta$. The pulsed drive field sequence 38 comprises a pair of discrete, alternate orientations labeled 1 and 2 separated by the angle 180° minus $\theta$ or preferably 120°. These orientations are parallel respectively with segments 34 and 36. Bubbles (not shown) under the overlay channel 32, attracted to the changing poles formed by the drive field 38, are propagated to the right, the direction of the drive field 38 as viewed in FIG. 3, through the bubble positions labeled 1 and 2 formed at the upper and lower vertices of the circuit respectively.

Figure 4:
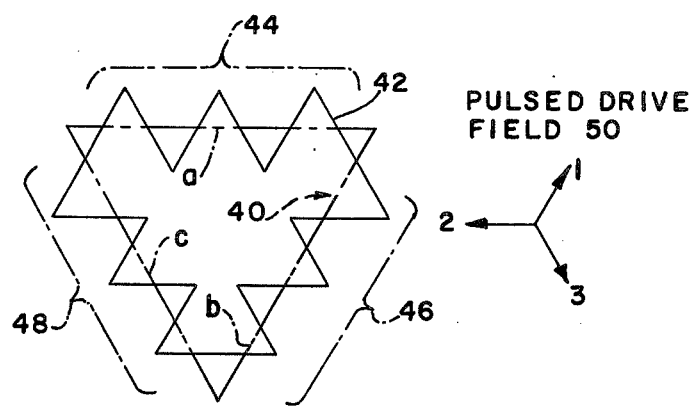
FIG. 4 is a schematic diagram illustrating a closed loop zigzag continuous overlay circuit and its associated drive field according to the invention.

FIG. 4 illustrates the manner in which closed loop continuous zigzag type circuits are constructed. The equilateral triangle 40 in FIG. 4 is drawn for reference as a constructional diagram. The overlay circuit itself is represented by the closed zigzag pattern 42 consecutively crisscrossing the sides of the triangle 40. The zigzag circuit 42, itself has three sides or sections 44, 46 and 48 corresponding to the sides $a$, $b$ and $c$ of the equilateral triangle 40. For each section 44, 46 or 48 the straight line segments of the zigzag pattern traverse or crisscross one side of the triangle 40, and the segments are alternatively parallel to the other sides of the same triangle. Thus section 44 of the zigzag circuit 42 crisscrosses side $a$ of the triangle and every other parallel individual element of the zigzag section 44 is parallel to side $b$ or side $c$. The section 46, on the other hand, crisscrosses side $b$ and is alternately parallel to sides $a$ and $c$. Similarly, section 48 crisscrosses side $c$ and is alternatately parallel to sides $a$ and $b$.

Pulsed drive field 50, shown in FIG. 4 to the right of the closed zigzag circuit 42, comprises a sequence of three pulsed field orientations, labeled arbitrarily 1, 2 and 3, which are aligned with sides $b$, $a$ and $c$ respectively of the construction triangle 40. Recalling from FIG. 3 that alternately pulsed drive fields parallel to the individual straight line segments composing a zigzag overlay channel and pointing in the same direction down the channel will drive bubbles in that direction along the channel, it can be seen in FIG. 4 that for any given section, 44, 46 or 48 only two of the three pulsed field orientations successfully propagate bubbles in that section. For example, in section 44 the drive field orientation labeled 2, parallel to side $a$ of triangle 40, has little effect on the propagation of bubbles in section 42. However, field orientations 1 and 3 are effective to drive bubbles to the right (clockwise) along section 44 in the manner shown in FIG. 3. In section 46, similarly, the field orientation 1 parallel to the traversed side *b* is ineffective to propagate bubbles while the other field orientations 2 and 3 are effective to propagate bubbles along this section. Sections 48 operates in the same manner driven by field orientations 1 and 2. Hence, the effective field orientations for each side or section of the closed loop circuit 40 are interlaced in the drive sequence. The fact that bubbles in one section of the circuit 42 are not in motion during the application of one of the three pulsed drive field orientations has no adverse effect upon the running of the circuit.

The equilateral triangle 40 on which the circuit 42 is based is employed because it provides maximum isloation of the three field orientations. That is, this arrangement permits the field orientation parallel to the travesed side to have minimum effect on a zigzag circuit section coresonding to that side. While 60° is believed to be the best angle for achieving this type of circuit, clearly analogous circuits with angles differing from 60° are possible in achieving closed loop configurations. In addition, constructional figures, like triangle 40 in FIG. 4, do not have to be triangles but may be any polygon having any number of sides restricted to three orientations, preferably at 60° angles, where circuit sections along any parallel sides will not be required to propagate in opposite directions.

Figure 5:
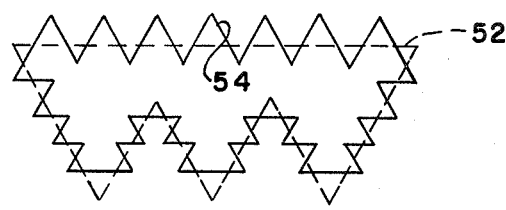
FIG. 5 is a schematic diagram illustrating a variation on the closed loop zigzag circuit of FIG. 4.

Another example of the closed loop, continuous zigzag circuit based on a 60° angle is shown in FIG. 5 in which the constructional FIG. 52 consists of a horizontal line interconnecting the ends of a series of three sawteeth. The zigzag circuit 54 is drawn so as to crisscross the respective sides of the FIG. 52 to form a closed loop. The resulting circuit is driven by pulsed drive field 50 in FIG. 4 in a manner similar to that for the regular triangular circuit 42.

Figure 6:
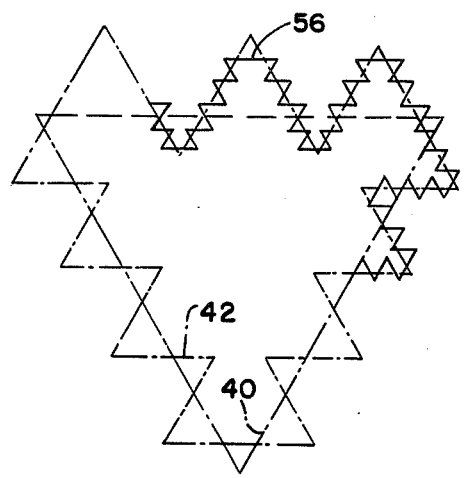
FIG. 6 is a schematic diagram indicating a technique for generating successively more complex closed loop zigzag circuits.

Another closed loop circuit is shown in FIG. 6 driven by the pulsed drive field sequence 50, where the circuit 42 of FIG. 4 itself forms a constructional FIG. 42 to generate a more complex form of zigzag circuit 56. Again all of the elements of the resulting zigzag circuit 56 are alternately parallel to respective ones of the sides of the original triangle 38 and propagation along parallel sections is in the same direction. In a similar manner the complex zigzag circuit 56 can be used itself as a constructional figure to produce a third generation closed loop zigzag circuit still more complex. This process of producing successive constructional figures for successive generations of zigzag circuits can be carried out as far as desired, in the nature of Peano diagrams in the field of topology, in order to efficiently utilize the space available on the bubble chip. No matter how complex the closed zigzag pattern becomes, it will be composed of zigzag sections whose general direction of propagation is parallel to one of the sides of the original equilateral triangle, and thus propagation over this section will be affected by two of the three pulsed field orientations 48. It is important to note that these closed loop circuits can not be driven by a uniformly, rotating magnetic field; they must be driven by a sequence of pulsed fields such as field sequence 50.

Figure 7:
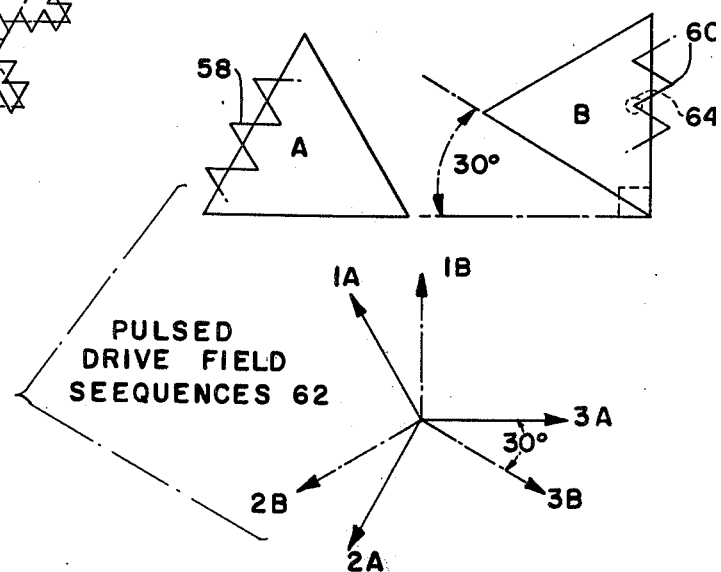
FIG. 7 is a schematic diagram illustrating a pair of mutually exclusive field-accessed closed loop circuits and their respective drive field sequences according to the invention.

FIG. 7 illustrates the principle of mutually exclusive field-accessed, closed loop circuits. In this embodiment, a pair of closed loop zigzag circuits 58 and 60 are based respectively on equilateral triangles A and B, symbolizing the two closed loop circuits. Because of the offset angular orientations of the circuits A and B, when these circuits are placed on the same chip, one may be driven by one sequence of pulsed dirve fields while the other is inoperative and vice versa. In particular, circuit B is tipped approximately 30° relative to the orientation of circuit A. Because the circuits A and B are both built on 60° angles, the three sides of circuit B each make an angle of 30° with the three corresponding sides of circuit A. Expressed differently, the sides of triangle B are orthogonal to the sides of triangle A. This angular separation is sufficient to render the subset 1A, 2A and 3A of the pulsed drive field sequences 62 inoperative to drive bubbles on the circuit B while it successfully propagates bubbles on the circuit A. Conversely, the subset 1B, 2B and 3B, offset by 30° from the A subset, is ineffective to propagate bubbles in circuit A while successfully moving bubbles around the circuit B. Hence circuits A and B are mutually exclusive, field-accessed closed loop circuits.

The reasons why these particular circuits in FIG. 7 are mutually exclusive can be explained, for example, in terms of the action of the A sequence on the B circuit. Assume that the vectorial projections of the A orientations on corresponding segments of the B circuit are sufficient to affect the magnetic polarity of these segments. When the field 3A is applied to the righthand section (illustrated) of circuit 60(B), the field 3A, as the bisector of the angles made by the segments, affects adjoining segments equally. Thus a bubble 64 at an inner vertex, for example, will experience zero net attraction to move to an outer vertex. The next consecutive field orientations, 1A and 2A, will leave the bubble 64 where it is because they (i.e., their strongest vectorial projections) point along the adjoining segments toward the location already occupied by the bubble 64. This method of analysis holds true for any section of circuit B under consideration, and extends by direct analogy to the effect of field sequence B on circuit A.

While the embodiments diagrammed in FIG. 7 indicate a so-called "first generation" zigzag circuit configuration for circuits 58 and 60 with sections corresponding directly to the sides of the original constructional triangle, it should be clear that more complex forms can be used so long as the individual line segments making up the closed circuit zigzag overlay are parallel to the sides of a triangle, preferably equilateral, parallel sections propagate in the same direction and the triangles are sufficiently skewed relative to each other. As in the description of FIGS. 4 through 6, 60° angles are preferred although operative embodiments are not limited strictly to 60° angles, triangular configurations other than equilateral being feasible. Similarly, the principle of mutual exclusivity in field-accessed, closed loop circuits illustrated in FIG. 7 is not necessarily limited to continuous overlay zigzag circuits. Discrete circuit element, closed loop overlay patterns mutually exclusively operable by means of pulsed field orientations represent a feasible extension of the underlying principle of field-accessed closed loop mutual exclusivity.

As illustrated in the pulsed drive field sequences 62 in FIG. 7 the angle between sequence A and sequence B is 60°. Thus, for example, field 3A has a vectorial projection in the direction of field 3B whose magnitude is the cosine of 30°. Thus the field strength in the direction 3B attributable to a pulsed field in the direction 3A would be 86 percent of the full magnitude in the field in the direction 3A.

Figure 8:
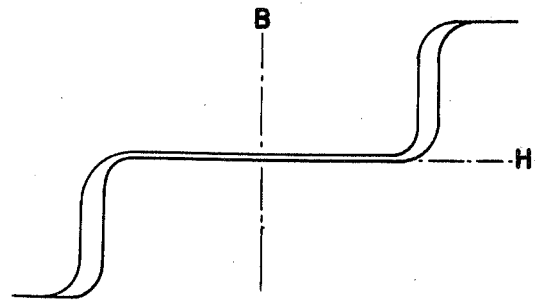
FIG. 8 is a graph indicating the hysteresis curve for a particular overlay material.

To enhance the exclusive operation of circuits A and B, the circuit material used for the continuous zigzag circuit, or whatever type of circuit is employed, is chosen with the right hysteresis curve such that saturation occurs in the presence of full field strength when the field is strictly aligned with the element in circuit A for example, while 86 percent field strength operating on the corresponding elements of circuit B is insufficient to saturate these elements, that is, it is not enough to switch the magnetic polarity of the corresponding elements. One example of a suitable hysteresis curve is shown in FIG. 8. A material whose magnetic properties approximate the hysteresis curve in FIG. 8 is the material perminvar.

The same general hysteresis property may also be obtained by deposition materials for the circuit overlay which have a tendency to remain magnetized perpendicular to their long axes. Such materials will evidence magnetization parallel to their long axes only above a certain critical field strength. Accordingly, the magnetic behaviour of such materials would also approximate the hysteresis loop shown in FIG. 8.

Yet another way of enhancing mutual exclusivity would be to drive the circuits A and B at the highest possible speed to take advantage of the restrictive operating margins of the circuits. Thus the A sequence of pulses might be well within the operating margins of circuit A. At the same time, because of reduced components of sequence A projected on circuit B, in combination with the high operating speed, circuit B would not be within its operting margins and thus would fail to function properly. All of these efforts described above have in common the principle of improving mutual exclusivity by enhancing the criticality of the drive field strenght such that the fully aligned field will cause saturation of parallel circuit elements while a field misaligned by as much as 30° will have an aligned component or projection which is not sufficient to saturate parallel circuit elements. Any parameter which trims the operating margins may be useful in this regard.

The invention may be embodied in other specific forms without departing from its spirit or central characteristics. The present embodiments are therefore to be considered in all respects as illustrative and not restricitve, the scope of the invention being indicated by the claims rather than by the foregoing description, and all changes which come within the meaning and range of equivalence of the claims are therefore intended to be embraced therein.

We claim:

1. A field-accessed bubble propagation system, comprising a sheet of magnetic bubble material, means for applying a magnetic bias field orthogonal to said sheet to produce and maintain bubbles therein, a continuous ferromagnetic overlay pattern operatively disposed on said sheet including a continuously repeating pattern of three differently oriented linear segments joined end-to-end in the form of a truncated sawtooth pattern, and means for applying a sequence of pulsed drive field orientations in the plane of said sheet realigning consecutively with said segments to propagate bubbles in one direction.

2. The propagation system of claim 1, wherein said overlay pattern is in the form of segmented semihexagonal sections joined serially end-to-end, said drive field orientations realigning consecutively with the segments of said semihexagonal sections to propagate bubbles in one direction from section to section.

3. The propagation system of claim 2, wherein said three segments are joined end-to-end such that the two end segments form 120° angles relative to the middle segment on the same side thereof.

4. The propagation system of claim 3 wherein a first one of said pulsed drive field orientations is aligned with one of said angled end segments in the direction of propagation, a second one of said drive field orientations being aligned with said middle segment in the direction of propagation and a third one of said drive field orientations being aligned with said other angled end segment in the direction of propagation.

5. A closed loop magnetic bubble propagation circuit, comprising a sheet of magnetic bubble material, means for applying a magnetic bias field orthogonal to said sheet to produce and maintain magnetic bubbles therein, a continuous ferromagnetic overlay circuit operatively disposed on said sheet forming a closed bubble propagation path, and means for applying a predetermined sequence of pulsed discrete drive field orientations in the plane of said sheet for propagating bubbles around said closed path.

6. A closed loop magnetic bubble propagation circuit, comprising a sheet of magnetic bubble material, means for applying a magnetic bias field orthogonal to said sheet to produce and maintain magnetic bubbles therein, a ferromagnetic overlay circuit operatively disposed on said sheet forming a closed bubble propagation path, means for applying a predetermined sequence of pulsed discrete drive field orientations in the plane of said sheet for propagating bubbles around said closed path, said closed path having a plurality of sides, said sequence of pulsed drive fields containing a plurality of different subsequences for propagating bubbles along corresponding ones of said sides.

7. The circuit of claim 6, wherein said subsequences are interlaced.

8. The circuit of claim 6, wherein said overlay circuit is continuous.

9. The circuit of claim 6, wherein said overlay circuit is continuous at least over each of said sides.

10. The circuit of claim 6, wherein said overlay circuit includes a many-sided closed configuration of zig-zag circuits, the straight segments of said zigzag circuits being parallel to the sides of a triangle, said circuits being arranged such that bubbles traverse parallel segments in the same direction.

11. The circuit of claim 10, wherein said triangle is an equilateral triangle.

12. The circuit of claim 10, wherein each side of said closed path is formed by a zigzag circuit composed of alternately oriented linear segments parallel respectively with two sides of said triangle.

13. The circuit of claim 6, wherein said closed path includes a many-sided closed path in whch each side is parallel to one side of a reference triangle, each side of said closed path being formed by a pattern of circuit elements for propagating bubbles in response to alternating alignment of said pulsed drive field with the other two sides of said triangle.

14. The circuit of claim 13, wherein said pattern is in the form of linear segments arranged end-to-end and alternately parallel to the other two sides of said triangle.

15. The circuit of claim 14, wherein said reference triangle is equilateral and said drive field sequence includes a repeating sequence of three pulsed fields consecutively angularly separated by 120°.

16. A closed loop continuous magnetic bubble propagation circuit, comprising a sheet of magnetic bubble material, means for applying a bias field orthogonal to said sheet to produce and maintain bubbles therein, and a magnetic bubble propagation overlay circuit on said sheet in the form of a continuous zigzag pattern crisscrossing the sides of a reference triangle such that the zigzag elements of said pattern on any given side of said crisscrossed triangle are parallel to the other two sides of said reference triangle, and means for applying a predetermined sequence of pulsed magnetic drive fields in the plane of said sheet in first, second and third directions respectively parallel to the sides of said reference triangle for propagating bubbles around said closed path.

17. A magnetic bubble propagation system comprising a sheet of magnetic bubble material, means for applying a magnetic bias field orthogonal to said sheet to produce and maintain bubbles therein, control means for applying pulsed drive fields in the plane of said sheet in a first sequence of first directions and in a second sequence of second directions each of which is different from and nonparallel to said first directions, two field-accessed magnetic bubble propagation paths formed by ferromagnetic circuit element overlays exclusively responsive respectively to said first and second sequences for propagating bubbles at different times.

18. The system of claim 17, wherein said paths are nonparallel.

19. The system of claim 17, wherein said first directions are nonparallel to each other and said second directions are nonparallel to each other.

20. The system of claim 17, wherein both of said propagation paths are responsive to the respective sequences for propagation in either the forward or reverse direction.

21. The system of claim 17, wherein each of said propagation paths is formed by a continuous circuit element overlay operatively disposed on said sheet.

22. The system of claim 17, wherein at least one of said paths forms a closed loop.

23. The system of claim 22, wherein the drive field sequence corresponding to said one path is composed of at least three nonparallel directions.

24. The system of claim 22, wherein each of said paths forms a closed loop.

25. The circuit of claim 24, wherein each of said closed loop paths includes a continuous zigzag circuit overlay.

26. The circuit of claim 24, wherein each of said paths is a many-sided closed loop path each side of which is parallel to one side of a corresponding one of two reference triangles associated respectively with said closed loop paths, the reference triangles for said two closed loop paths having approximately perpendicular sides, each side of each closed loop path being formed by a circuit pattern for propagating bubbles in response to alternating alignments of the fields in said first and second sequences respectively with the other sides of said reference triangles respectively.

27. Field-accessed mutually exclusive closed bubble propagation paths, comprising means defining a first many-sided closed bubble propagation path in which the sides of said path are parallel to corresponding sides of a first equilateral reference triangle having a first orientation, means for applying a sequence of three pulsed drive fields aligned respectively with the sides of said first equilateral triangle for propagating bubbles around said first closed path, each side of said first closed path being formed by a circuit pattern overlay for propagating bubbles along said side in response to alternating alignment of said first sequence of drive fields with the other two sides of said first reference triangle, a second many-sided closed bubble propagation path the sides of which are parallel to corresponding sides of a second equilateral reference triangle having a second orientation such that the sides of said second triangle are nonparallel to the sides of said first triangle, means for applying a second sequence of three pulsed drive fields aligned respectively with the sides of said second triangle, each side of said second closed path being formed by a circuit pattern overlay for propagating bubbles along said side in response to alternating alignment of said second sequence of pulsed drive fields with the other two sides of said second triangle.

28. The circuit of claim 27, wherein the sides of said second triangle are approximately perpendicular to the sides of said first triangle.

29. The circuit of claim 27, wherein said circuit pattern overlay for each side is composed of linear segments disposed end-to-end and alternately aligned with said other two sides of said first or second reference triangle.

30. The circuit of claim 29, wherein the magnetic properties of said circuit elements are predetermined such that orientations of said first field sequence cause saturation of correspondingly aligned circuit elements in said first closed path but not of those in said second closed path and said second sequence of pulsed drive fields causes saturation of correspondingly aligned elements in said second closed path but not of those in said first closed path.

31. The circuit of claim 30, further comprisng means for enhancing the criticality of the field strengths of said first and second sequences of pulsed drive fields to ensure mutual exclusivity of propagation in said first and second closed paths.

* * * * *